Aug. 23, 1932. S. BALLANTINE ET AL Re. 18,579

DEMODULATOR AND METHOD OF DEMODULATION

Original Filed June 8, 1923 4 Sheets-Sheet 1

Static Characteristics
Iron-point Contacts
on
Refined Silicon

1. Non-rectifying "insensitive"
2. Rectifying "sensitive"
3. " " (higher resistance)

Inventors:
Stuart Ballantine,
Lewis M. Hull,
By Byrne, Townsend & Brickenstein,
Attorneys.

Aug. 23, 1932. S. BALLANTINE ET AL Re. 18,579

DEMODULATOR AND METHOD OF DEMODULATION

Original Filed June 8, 1923 4 Sheets-Sheet 2

Static Characteristics
Iron and Iron-Pyrite Contacts
on
Ferro-Silicon

1. Ferro-Silicon, 25% Fe.
2. " " " "
3. " " and Iron-Pyrites

Inventors:
Stuart Ballantine,
Lewis M. Hull,
By Byrne Townsend & Bickenstein,
Attorneys.

Variation of Exponent in Law of Response
Ferro-Silicon Rectifier
Signal Voltage with 50% Modulation
$v_{audio} = Ae^{k}_{radio}$ Inventors:
Stuart Ballantine,
Lewis M. Hull,
By Byrne, Townsend & Brickenstein,
Attorneys.

Jan. 8, 1929.

S. BALLANTINE ET AL

DEMODULATOR AND METHOD OF DEMODULATION Re. 18,579

Original Filed June 8, 1923 4 Sheets-Sheet 4

Inventors:
Stuart Ballantine,
Lewis M. Hull,
By Byrne, Townsend & Brickenstein,
Attorneys.

Reissued Aug. 23, 1932

Re. 18,579

UNITED STATES PATENT OFFICE

STUART BALLANTINE AND LEWIS M. HULL, OF MOUNTAIN LAKES, NEW JERSEY, ASSIGNORS, BY MESNE ASSIGNMENTS, TO RADIO CORPORATION OF AMERICA, OF NEW YORK, N. Y., A CORPORATION OF DELAWARE

DEMODULATOR AND METHOD OF DEMODULATION

Original No. 1,698,668, dated January 8, 1929, Serial No. 644,215, filed June 8, 1923. Application for reissue filed October 1, 1930. Serial No. 485,785

This invention relates to demodulators for use in radio receiving circuits, particularly those used for radio telephony, and to methods of demodulation.

An object of the invention is to provide a demodulator which is free from distortion. A further object of the invention is to provide a method of demodulation by which the audio frequency output current may be made proportional to the first power of the radio frequency amplitude. A further object is to provide a method of demodulation by which the stimulus-response characteristic of the demodulator may be adjusted to give a true and undistorted copy of the modulating currents operating in the transmitter, and to adjust the tonal characteristics of the sounds produced.

The usual system of demodulation is based upon the use of a circuit element or device, usually called a "detector", which possesses an asymmetrically conducting property. The essential property of the detector, in prior art, is not a true unilateral conductivity, resulting in simple rectification, but the property of asymmetrical conductivity corresponding to the curvature of its current-voltage characteristic. It has been recognized that the audio-frequency current obtained in prior devices is not a true copy of the original modulation of the signal and it can be demonstrated that the detected audio-frequency current is not of a lower order than the second power of the impressed signal voltage.

According to the present invention, however, the old types of detectors which rely solely upon asymmetrical conductivity are abandoned and we employ instead a detecting element having a certain operating range in which the response is directly proportional to the amplitude of the impressed voltage stimulus. Thus by means of our invention we are able to obtain in response to a modulated radio frequency signal voltage an audio frequency current whose amplitude is directly proportional to the amplitude of said radio frequency voltage. This linear relation obtained between the stimulus impressed upon our demodulating device and the audio frequency response stands in contrast with the square-law relation characteristics of ionic tube and crystal detectors as commonly employed and results in a marked improvement in the tonal quality of the demodulated signal.

Our invention will now be described in detail, reference being made to the accompanying drawings in which, Fig. 1 is a diagrammatic representation of static current-voltage characteristics for asymmetrical conductors of a type commonly used in the detection of signals.

Figure 1:
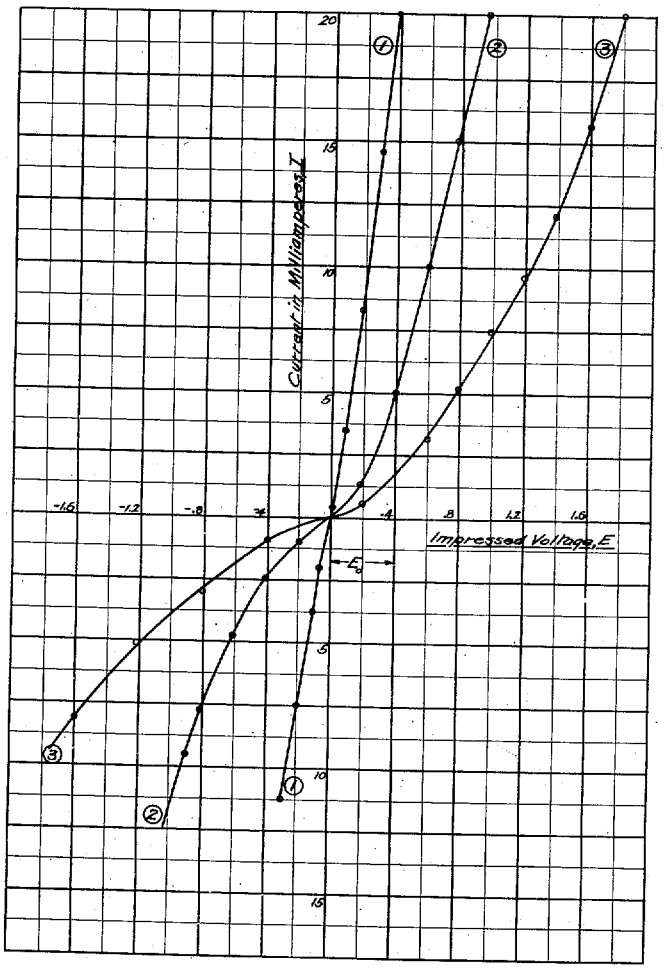

The experimental data which is represented in the curves of Fig. 1 was obtained by measurements taken on an asymmetrical conductor formed by a light metallic point-contact upon a crystal of refined silicon. The characteristic curves were obtained for three different points by impressing a steady but reversible voltage upon the detector and measuring the resulting current in the two directions for direct and reversed voltage. When operated by a radio-frequency signal voltage over a small range on one of these curves the direct current and audio-frequency current components are greater, the greater the curvature of the characteristic. Accordingly the characteristic marked 3 represents an operating condition more favorable for detection than that marked 2; 2 represents a more favorable condition than 1, where the detector is practically a simple conductor, without appreciable detecting properties. The curvature and general form of the current-voltage characteristics depend first upon the composition of the crystalline substance, and second, upon the location and pressure of the contact point. Locations upon the crystal surface at which the current-voltage curve is highly asymmetrical are commonly characterized as "sensitive spots" in the crystal and can be located by connecting the crystal in series with a telephone receiver and with a source of modulated radio-frequency voltage and exploring the crystal while listening for the sound which indicates a detection of the modulated wave. It was by this method that the spots whose characteristics are shown at 2 and 3 were located.

The audio-frequency current which is passed by an asymmetrical conductor such as described is a function of the voltage and may be expressed as $i=f(e)$. The absolute strength of the signal is small and the device may be polarized by means of an auxiliary steady E. M. F. so adjusted that operation takes place about the point $E_0$ on the characteristic curve 3 of Fig. 1. Then expanding $i$ in a power series about this point, denoting the difference between E and $E_0$ by $e$, we have:

$$I=I_0+f'e+\frac{1}{2}f''e^2+\frac{1}{6}f'''e^3+\text{----} \quad (1)$$

where the symbols $f'$, $f''$, $f'''$ indicate the first, second and third derivatives, respectively, of $i$ with respect to $e$, taken at the point $E_0$. Now a radio telephone signal is impressed upon the detector and for simplicity this signal will be taken as of the following generic type:

$$e=F(t)\sin\varpi t \text{ -------} \quad (2)$$

where $\varpi$ represents the radio-frequency angular velocity, and $F(t)$ the function, called the modulation function, which describes the variation in amplitude of the radio frequency wave. The variation in the current thru the detector consequent to the application of (2) can be calculated from (1), neglecting for simplicity, any ordinary linear impedances which may be in the circuit. Thus $$I=I_0+fF(t)\sin\varpi t+\frac{1}{2}f''F^2(t)\sin^2\varpi t+\text{----}$$

$$I=I_0+fF(t)\sin\varpi t+\frac{1}{4}f''F^2(t)-\frac{1}{4}f''F^2(t)\cos 2\varpi t+\text{----}$$

The production of a current of the type of the modulation function $F(t)$ is thus seen to depend upon the presence of derivatives of the second and higher even orders. The important thing to be noticed is that the relation between the "detected" audio-frequency current and the impressed signal voltage is not of a lower order than the second, and as an important practical result of this, the signal is distorted in the process of detection. This second-order detection, resulting in a square-law response and distortion of the signal is an inherent result of operation upon an asymmetrical, continuously curved characteristic. If the characteristic were not continuously curved the above power series would not be a legitimate expansion of $i$ as a function of $e$. In order that the audio current shall be a faithful copy of the original modulation of the signal the stimulus-response characteristic of the detection, or demodulation process must be linear; otherwise the various component vibrations in the spectrum of the complex sound will not be dealt with in a proportionate fashion. As we have just shown, such a characteristic is impossible of attainment using the property of asymmetrical conductivity of the detector as is the practice of the present day.

It must be emphasized that although a silicon crystal having a continuously curved characteristic has been taken here as an example of the usual square-law detector, the same considerations and the same mathematical reasoning apply without modification to the ionic-tube detector, wherein the detection of modulated signals is brought about by the curvature (second and higher derivatives) of the current-voltage characteristic of some conducting branch of the tube. It is a fact familiar to most experimenters that the audio-frequency response of all ionic-tube detectors is proportional to the square of the modulated impressed voltage over wide ranges of operation.

It can be shown mathematically that the current-voltage characteristic of the ideal demodulator would consists of two straight lines meeting at an angle at some definite point, which point should be used as the operating point. With a conductor of this eccentric nature the audio-frequency currents flowing as a result of the impression of a modulated radio-frequency voltage would be directly proportional to the voltage amplitude. Experience has indicated, however, that no conductors of this ideal character exist and no person has been able to produce one by mechanical or electrical combinations. Continuous curvature over a finite voltage range has been exhibited by the conduction characteristics of all such combinations which do not follow Ohm's law.

Figure 2:
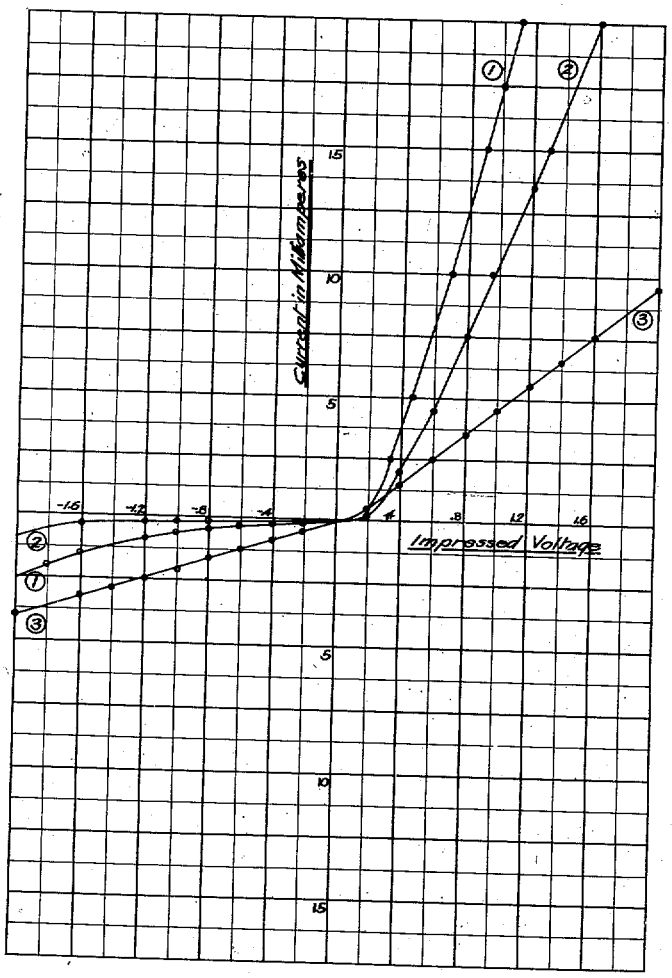
Fig. 2 is a diagrammatic representation of static current-voltage characteristics of a detector element having substantially constant conductivity over a wide range.

We have found that light metallic contacts upon a commercial ferro-silicon alloy containing about 70% to 80% silicon and about 20% to 30% iron, in the crystalline form in which this alloy comes from the electric furnace, yield current voltage characteristics of which those shown in Fig. 2 at 1 and 2 are typical. These curves indicate that for impressed voltages in one direction (arbitrarily taken as positive upon the diagram) the resistance is practically constant, giving a linear current-voltage characteristic; that the regions of curvature of the characteristics are, in general, very limited, extending over not more than 0.3 volt about the origin; and finally, that for voltages in the reverse direction (negative) the resistance is practically constant up to 1 volt and for higher voltages the curvature is relatively very small. We have found that contacts upon alloys of the above-mentioned compositions yield curves having the nearest approach to the ideal shape of two intersecting straight lines. With ferro-silicon having more than 30% iron the inclination to each other of the two branches of the curves gradually increases without increasing the range of curvature, until at about the 50% point all contacts lose their rectifying qualities and become simple straight-line conductors. With ferro-silicons containing 20% iron or less the region of curvature increases and the characteristics of sensitive contacts change gradually with increasing proportions of silicon into the quasi-cubic form shown for the silicon. It will be understood that the foregoing statements are based on the examination of a limited number of samples, and it is not excluded that ferro-silicon crystals having a chemical composition outside of the preferred range indicated may be found well adapted for the purposes of this invention. Hence the above statements as to the preferred constitution of the ferro-silicon are not to be regarded as restrictive of the invention. It will also be understood that the ferro-silicon may contain minor quantities of metals or elements other than iron and silicon.

It is rather difficult, under these conditions, when the curves depend upon the location of contact as well as upon the nature of the fundamental substance, to isolate with certainty those qualities which depend only upon the composition. It should be noted however that although the curves for different contacts upon a substance of a given composition may differ widely in extent and curvature, the general shape or type of curves for all contacts on a given substance is the same; thus the general form of all curves for contacts upon commercially pure silicon (Fig. 1) is that of a cubic through the origin of coordinates, one branch of which is displaced or distorted from the true form representing a cubic equation, thus providing a certain asymmetry about the origin. By investigating a large number of contacts upon different samples of the ferro-silicon and upon the commercially pure silicon we have determined conclusively that the form shown in Fig. 2 is typical of sensitive spots upon the ferro-silicon, and that the form shown in Fig. 1 is typical of sensitive spots upon the silicon, and we have never found characteristics of any spots upon the ferro-silicon and the silicon which approached each other in form more closely than curve 3 of Fig. 1 and curve 1 in Fig. 2.

We have also discovered that a further approach to the ideal characteristic can be accomplished by using, in place of an iron or copper contact point upon the ferro-silicon, a point of iron pyrite ($FeS_2$). A splinter of this substance, when held in light contact with a sensitive spot on the ferro-silicon, yields volt-ampere characteristics of which the one shown at 3 in Fig. 2 is typical. Owing to some superposition of the surface conducting qualities of the pyrite and the ferro-silicon, both branches of the characteristic curve become so nearly straight lines that it is impossible to detect any curvature at points removed from the main bend, at the origin of coordinates. We have found, however, that this desirable feature is compensated to some extent, from a practical standpoint by such a decrease in the relative inclination of the two branches of the curve that the rectifying sensitivity of the most sensitive point that can be located with an iron-pyrite contact point smaller than that obtainable with the simple iron or copper contact point.

Figure 3:
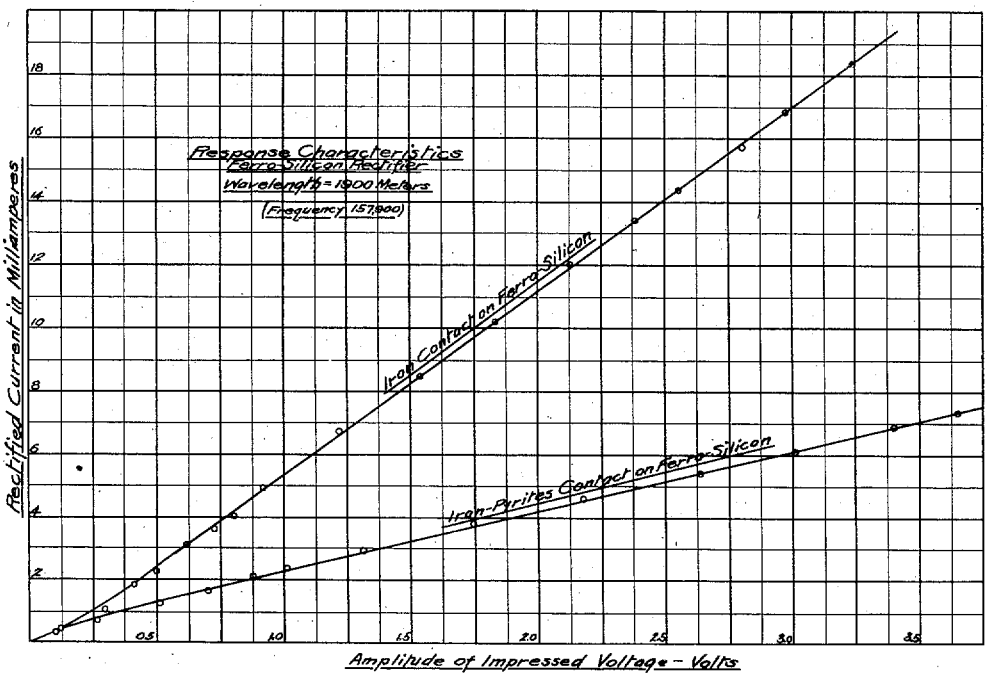
Fig. 3 is a diagrammatic representation of experimental response characteristics for a detector element having current-voltage characteristics as shown in Fig. 2.

Further experimental tests with radio-frequency impressed voltages have shown that the slight departures of the characteristics of our rectifiers from the ideal non-distorting form are insignificant for all amplitudes of impressed voltage which are substantially greater than the range of curvature of the voltage-current characterisic. This is illustrated graphically in the stimulus-response curves of Fig. 3. Curves showing the direct current response as a function of the amplitude of an impressed radio frequency voltage are called "stimulus-response characteristics" as distinguished from the "voltage-current characteristics" which show the instantaneous value of current which flows through the rectifier as a function of the instantaneous impressed voltage. Data for these curves were obtained by impressing upon the rectifiers a measurable radio-frequency voltage, at a wave length of approximately 1900 meters (unmodulated) and measuring the resulting direct component of the resulting current flowing through the rectifier. The voltage amplitudes are plotted as abscissæ, and the rectified, or direct current as ordinates; curve 1 represents the results for an iron point contact on a ferro-silicon crystal (25% Fe), and curve 2, the results for a contact of iron pyrite upon a similar crystal. These curves indicate that the direct current response of our rectifiers to unmodulated voltage is directly proportional to the amplitude of said voltage throughout a range of amplitude extending from 0.3 volts to 3.5 volts. Within this range, therefore, these rectifiers behave as distortionless demodulators to modulated alternating voltages, since the magnitude of the audio-frequency response to a modulated radio-frequency voltage is directly proportional to the amplitude of the envelope of said voltage, and true demodulation, or first-power rectification results.

Figure 4:
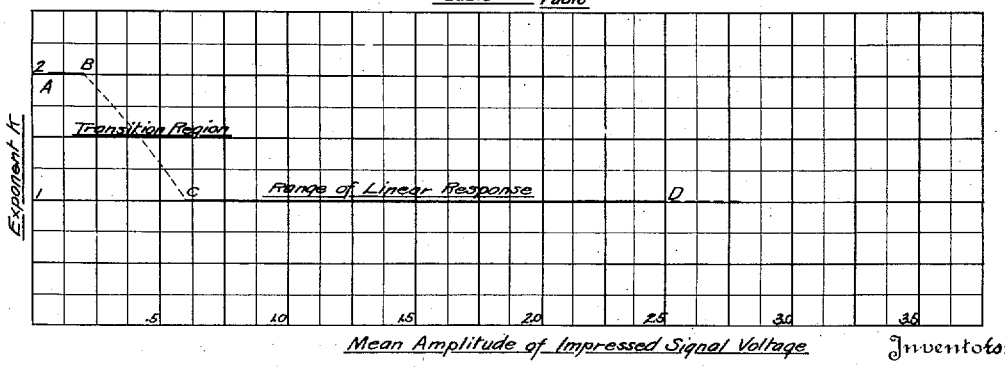
Fig. 4 is a diagrammatic representation of the variation of the exponent in the law of response for a detector element having a response characteristic such as shown in Fig. 3.

In order to illustrate more clearly the existence and boundaries of the region in which we operate our rectifiers as distortionless demodulators, the diagram, Fig. 4 is presented. The data for Fig. 4 were derived by computation from the experimental curves of Fig. 3. Suppose the radio signal voltage to be demodulated is symmetrically modulated to 50% about its mean value. Then if this signal voltage be so weak that its mean value does not exceed 0.2 volt, its peak value does not pass out of the region of continuous curvature on the rectifier characteristic (Fig. 3) and the rectifier operates as a square-law detector, the audio response being proportional to the square of the amplitude of the radio input. This condition of operation is represented by the region AB of the Fig. 4. If the mean amplitude of the modulated input lies between 0.2 volt and 0.6 volt, the input voltage crosses from the region of curvature on to the straight portion of the rectifier characteristic in every radio-frequency cycle, and the law of response of the rectifier cannot be expressed as a single power of the impressed voltage; this is indicated by the "transition region" shown on the diagram from B to C, in which the simple exponential relation:

$$i_{\text{audio}} = Ae^{k}{}_{\text{radio}}$$

breaks down, and the exponent $k$ is indeterminate. With signal voltages whose mean amplitude exceeds 0.6 volt, however, the audio output is proportional to the first power of the amplitude of the modulated input, and it is in this region that we operate our rectifiers as distortionless demodulators, represented by C to D on the diagram. Of course the extent of this range of linear response depends, for a given rectifier characteristic, upon the degree of modulation of the incoming signal; this region always exists, however, and we have chosen the case of 50% modulation merely to illustrate and to define what we mean by the range of linear response with respect to the characteristics of a particular ferro-silicon contact.

Modulated signal voltages of the order of magnitude 0.001 volt, obtained across the reactance elements of a receiving antenna can be detected and heard with existing practical apparatus. In order to render our invention useful in connection with certain weak signal voltages obtained in practice, therefore, we combine our ferro-silicon rectifier with means for obtaining high radio-frequency amplification of the signal voltage before it is impressed upon the rectifier. The essential feature of this process is the provision that the modulated amplitude of this signal voltage shall be so adjusted before being impressed upon the rectifier that it falls wholly within the above-defined range of linear response of the rectifier. For most rectifiers which fall within the scope of our invention we contemplate amplification of such an extent that the voltage impressed upon the rectifier shall exceed 1 volt and may exceed ten volts. We have discovered no definite upper limit to the range of linear response with iron contacts on the ferro-silicon, and prefer therefore to employ as high radio-frequency voltages as are consistent with stable operation of the amplifier in order to minimize the effects of variations in the slope of the operating characteristic of the rectifier with the location of the contact point upon the crystal surface. Recent improvements in cascaded ionic tube amplifiers invented by Ballantine and described in the copending application (Serial No. 629,702, filed April 3, 1923) which relate to the elimination of the effect of reaction from plate to grid circuit in every tube, make possible the cascading of tubes in any number of stages, so that any desired amplification may be obtained.

Figure 5:
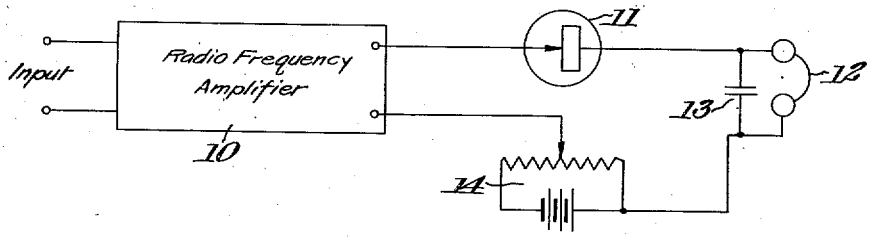
Figs. 5 and 6 are diagrams of apparatus embodying our invention.

The apparatus which is employed for securing the desired amplification and distortionless detection of modulated radio frequency waves may take various forms. As shown diagrammatically in Fig. 5, the demodulator includes a multi-stage radio frequency amplifier 10 of any appropriate construction from which the amplified signal wave is passed to a ferro-silicon rectifier 11 having an iron or iron-pyrite contact point. The detected audio-frequency currents pass through the telephone 12 which is preferably shunted by a by-pass condenser 13. It is usually unnecessary to provide a bias voltage, but when this is desired the audio-frequency circuit may include an auxiliary voltage divider 14.

Figure 6:
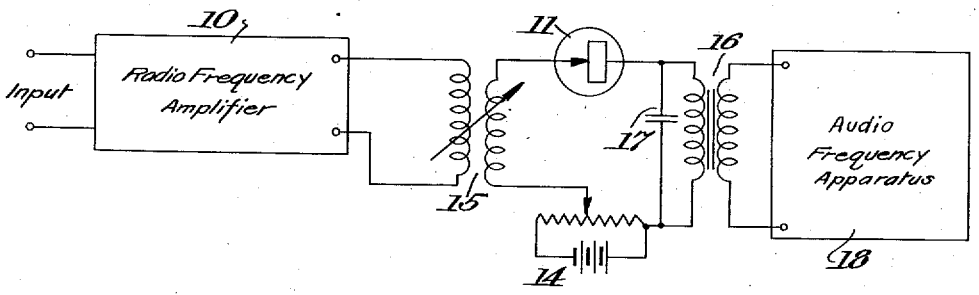

In the preferred embodiment of the invention which is illustrated in Fig. 6, the demodulator includes a radio-frequency inductive coupling 15 between the multi-stage radio-frequency amplifier 10 and the ferro-silicon rectifier 11. The radio-frequency coupling preferably comprises a vario-transformer such as described in the copending application of Ballantine, Serial No. 590,514, filed September 25, 1922, and its purpose is to keep currents inadvertently rectified by the amplifier out of the rectifier circuit. The rectifier circuit includes the secondary of the transformer 15, the rectifier 11, and the primary of an audio-frequency transformer 16. The primary of the transformer 16 is preferably shunted by a condenser 17, and if desired a voltage divider 14 may be included in the rectifier circuit. The audio frequency apparatus 18 which is connected across the secondary of the transformer 16 may comprise any suitable arrangement of audio-frequency amplifying units, telephones, loud speaker, etc.

In laboratory tests with the circuit shown in Fig. 6, excellent distortionless demodulation was obtained when the radio-frequency amplifier 10 comprises three UV 201A tubes coupled with vario-transformers and the transformer coupling 15 was also a vario-transformer.

Although we have found that certain ferro-silicon compositions are well adapted for use in carrying out our method of distortionless demodulation, particularly when such compositions are used with iron-pyrite contacts, it will be understood that our invention is not limited to rectifiers of this composition.

Our method of demodulation may be used with any rectifier having constant conductivity over a substantial range of the impressed voltage, which conductivity is different in the two directions about the operating point, by adjusting the amplitude of the modulated radio-frequency wave to bring the entire envelop of this wave within the previously defined range of linear response. It will be apparent that little or no radio frequency amplification will be required when strong signals are to be received or when the rectifier has such properties that its current-voltage characteristic has a very short curved portion lying between the two ranges of substantially uniform conductivity, i. e., the linear portions of the characteristic. When the strength of the signals is low or when the rectifier has such properties that the linear portions of the characteristic are joined by a relatively long curve, more amplification will be necessary to satisfy the requirement that the envelop of the modulated wave must fall within the range of linear response.

We claim:

1. Method of operating a radio receiving system suitable for the reception of modulated carrier-wave signals and of the type including a demodulator characterized by the fact that over a substantial range of impressed voltages the relation between impressed voltage and output current is substantially linear, which comprises amplifying received signal voltages to values within said range of linear response, and impressing said amplified voltages upon said demodulator.

2. Method of operating a radio receiving system suitable for the reception of carrier-wave signals and of the type including a demodulator characterized by the fact that over a substantial range of impressed voltages in excess of approximately 1.0 volt the relation between impressed voltage and output current is substantially linear, which comprises amplifying received signal voltages to values substantially in excess of 1.0 volt, and impressing said amplified voltages upon said demodulator.

3. A radio receiving system suitable for the reception of modulated carrier-wave signals and comprising, in combination, a demodulator characterized by the fact that over a substantial range of impressed voltages the relation between impressed voltage and output current is substantially linear; means for amplifying received signal voltages to values within said range of linear response; and means for impressing said amplified voltages of said values upon said demodulator.

4. A radio receiving system suitable for the reception of modulated carrier-wave signals, and comprising, in combination, a demodulator characterized by the fact that over a substantial range of impressed voltages in excess of approximately 1.0 volt, the relation between impressed voltage and output current is substantially linear; means for amplifying received signal voltages to values substantially in excess of 1 volt; and means for impressing said amplified voltages of said values upon said demodulator.

5. A radio receiving system suitable for the reception of modulated carrier-wave signals and comprising, in combination, a demodulator characterized by the fact that over a substantial range of impressed positive voltages the relation between applied voltage and output current is substantially linear, over a substantial range of impressed negative voltages the relation between applied voltage and output current is substantially linear, and over a small intermediate range of impressed positive and negative voltages the current-voltage characteristic is curved, the slopes of said linear portions of the current-voltage characteristic being different so that said linear portions are mutually inclined; means for amplifying received signal voltages to values substantially within the region represented by said linear branches; and means for impressing said amplified voltages of said values upon said demodulator.

6. A radio receiving system suitable for the reception of modulated carrier-wave signals, and comprising, in combination, a demodulator characterized by the fact that over a substantial range of impressed positive voltage in excess of approximately 1.0 volt the relation between applied voltage and output current is substantially linear, over a substantial range of impressed negative voltages in excess of approximately 1.0 volt the relation between applied voltage and output current is substantially linear, and over a small intermediate range of impressed positive and negative voltages lying between approximately 1.0 volt positive and 1.0 volt negative the current-voltage characteristic is curved, the slopes of said linear portions of the current-voltage characteristic being different so that said linear portions are mutually inclined; means for amplifying received signal voltages to values substantially in excess of 1 volt; and means for impressing said amplified voltages of said values upon said demodulator.

7. A radio receiving system suitable for the reception of modulated carrier-wave signals and comprising, in combination, a detector crystal composed of ferro-silicon, and characterized by the fact that its voltage-current characteristic comprises two mutually inclined substantially linear branches joined by a relatively short curved portion; a radio frequency amplifier for amplifying incoming signals to values substantially within the region represented by said linear branches; and means for impressing said amplified voltages of said values upon said detector crystal.

8. In combination, a detector comprising ferro-silicon and characterized by the fact that its voltage-current characteristic comprises two mutually inclined substantially linear branches joined by a short curved portion; and means for so adjusting the voltage of the incoming radio frequency waves that it will substantially exceed that critical value above which the rectified current is lineally proportional to the impressed radio frequency voltage.

9. A detector for radio frequency oscillations, composed of an alloy of iron and silicon between the limits of 20 percent iron—80 percent silicon, and 30 percent iron—70 percent silicon, said alloy being in crystalline form, and characterized by a voltage-current characteristic curve having two mutually inclined substantially linear branches.

10. In a demodulator, a rectifying device comprising a crystal of ferro-silicon and an iron-pyrite contact.

11. The method of operating a radio receiver including a detector, which includes adjusting said detector for its maximum rectification and applying to said detector a modulated carrier wave of such amplitude as to produce a substantially linear ratio between the rectified response and the percentage modulation of said carrier wave.

In testimony whereof we affix our signatures.

STUART BALLANTINE.
LEWIS M. HULL.